(12) United States Patent
Patrick

(10) Patent No.: US 7,387,908 B2
(45) Date of Patent: Jun. 17, 2008

(54) CMOS IMAGER WITH ENHANCED TRANSFER OF CHARGE AND LOW VOLTAGE OPERATION AND METHOD OF FORMATION

(75) Inventor: Inna Patrick, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/093,294

(22) Filed: Mar. 30, 2005

(65) Prior Publication Data
US 2005/0181568 A1  Aug. 18, 2005

Related U.S. Application Data

(62) Division of application No. 10/378,938, filed on Mar. 5, 2003, now Pat. No. 7,078,745.

(51) Int. Cl.
*H01L 21/00* (2006.01)
(52) U.S. Cl. .......................... 438/73; 438/66; 438/174; 438/289; 257/221; 257/122; 257/E27.131
(58) Field of Classification Search .............. 438/66, 438/174, 276, 48, 73, 288, 87; 257/335, 257/E27.131, 66, 121, 174, 221, 233
See application file for complete search history.

(56) References Cited

U.S. PATENT DOCUMENTS

| | | | | |
|---|---|---|---|---|
| 5,625,210 A | * | 4/1997 | Lee et al. | 257/292 |
| 5,668,390 A | | 9/1997 | Morimoto | |
| 5,801,416 A | * | 9/1998 | Choi et al. | 257/335 |
| 6,504,193 B1 | * | 1/2003 | Ishiwata et al. | 257/291 |
| 6,521,926 B1 | * | 2/2003 | Sasaki | 257/292 |
| 6,570,201 B2 | * | 5/2003 | Shim | 257/292 |
| 6,661,459 B1 | | 12/2003 | Koizumi | |
| 6,744,084 B2 | | 6/2004 | Fossum | |

\* cited by examiner

*Primary Examiner*—Howard Weiss
*Assistant Examiner*—John C Ingham
(74) *Attorney, Agent, or Firm*—Dickstein Shapiro LLP

(57) ABSTRACT

A dopant gradient region of a first conductivity type and a corresponding channel impurity gradient below a transfer gate and adjacent a charge collection region of a CMOS imager photodiode are disclosed. The channel impurity gradient in the transfer gate provides a complete charge transfer between the charge collection region of the photodiode and a floating diffusion node. The dopant gradient region is formed by doping a region at one end of the channel with a low enhancement dopant and another region at the other end of the channel with a high enhancement dopant.

56 Claims, 11 Drawing Sheets

CMOS IMAGER WITH ENHANCED TRANSFER OF CHARGE AND LOW VOLTAGE OPERATION AND METHOD OF FORMATION

CROSS REFERENCE TO RELATED APPLICATIONS

The present application is a divisional of U.S. application Ser. No. 10/378,938, filed on Mar. 5, 2003 now U.S. Pat. No. 7,078,745, the disclosure of which is herewith incorporated by reference in its entirety.

The present invention relates to the field of semiconductor devices and, in particular, to improved photodiodes for high quantum efficiency.

BACKGROUND OF THE INVENTION

The semiconductor industry currently uses different types of semiconductor-based imagers, such as charge coupled devices (CCDs), photodiode arrays, charge injection devices and hybrid focal plane arrays, among others.

Because of the inherent limitations and expense of CCD technology, CMOS imagers have been increasingly used as low cost imaging devices. A CMOS imager circuit includes a focal plane array of pixel cells, each one of the cells including either a photodiode, a photogate or a photoconductor overlying a doped region of a substrate for accumulating photo-generated charge in the underlying portion of the substrate. A readout circuit is connected to each pixel cell and includes a charge transfer section formed on the substrate adjacent the photodiode, photogate or photoconductor having a charge sensing node, typically a floating diffusion node, connected to the gate of a source follower output transistor. The imager may include at least one transistor for transferring charge from the charge accumulation region of the substrate to the floating diffusion node and also has a transistor for resetting the diffusion node to a predetermined charge level prior to charge transfer.

In a conventional CMOS imager, the active elements of a pixel cell typically perform the necessary functions of: (1) photon to charge conversion; (2) accumulation of image charge; (3) transfer of charge to the floating diffusion node; (4) resetting the floating diffusion node to a known state before the transfer of charge to it; (5) selection of a pixel for readout; and (6) output and amplification of a signal representing pixel charge. The charge at the floating diffusion node is converted to a pixel output voltage by the source follower output transistor. The photosensitive element of a CMOS imager pixel is typically either a depleted p-n junction photodiode or a field induced depletion region beneath a photogate.

CMOS imaging circuits of the type discussed above are generally known and discussed in, for example, Nixon et al., "256.times.256 CMOS Active Pixel Sensor Camera-on-a-Chip," IEEE Journal of Solid-State Circuits, Vol. 31(12), pp. 2046-2050 (1996); and Mendis et al., "CMOS Active Pixel Image Sensors," IEEE Transactions on Electron Devices, Vol. 41(3), pp. 452-453 (1994), the disclosures of which are incorporated by reference herein.

A schematic top view of a semiconductor wafer fragment of one exemplary CMOS sensor pixel four-transistor (4T) cell 10 is illustrated in FIG. 1. As it will be described below, the CMOS sensor pixel cell 10 includes a photo-generated charge accumulating area 21 in an underlying portion of the substrate. This area 21 is formed as a pinned photodiode 11, shown in FIG. 2, formed as part of a p-n-p structure within a substrate 20. The pinned photodiode is termed "pinned" because the potential in the photodiode is pinned to a constant value when the photodiode is fully depleted. It should be understood, however, that the CMOS sensor pixel cell 10 may include a photogate, photoconductor or other image to charge converting device, in lieu of a pinned photodiode, as the initial accumulating area 21 for photo-generated charge.

The CMOS image sensor 10 of FIG. 1 has a transfer gate 30 for transferring photoelectric charges generated in the charge accumulating region 21 to a floating diffusion region (sensing node) 25. The floating diffusion region 25 is further connected to a gate 50 of a source follower transistor. The source follower transistor provides an output signal to a row select access transistor having gate 60 for selectively gating the output signal to terminal 32. A reset transistor having gate 40 resets the floating diffusion region 25 to a specified charge level before each charge transfer from the charge accumulating region 21.

As noted, the charge accumulating region 21 may be formed as a pinned p-n-p photodiode 11 which has a p-type layer 24, an n-type region 26 and the p-type substrate 20. The pinned photodiode 11 includes two p-type regions 20, 24 and the n-type photodiode region 26 which is fully depleted at a pinning voltage. Impurity doped source/drain regions 22 (FIG. 1), preferably having n-type conductivity, are provided on either side of the transistor gates 40, 50, 60. The floating diffusion region 25 adjacent the transfer gate 30 is also preferable n-type.

FIG. 2 also illustrates a portion of trench isolation regions 15 formed adjacent the charge accumulating region 21. The trench isolation regions 15 are typically formed using a conventional STI process or by using a Local Oxidation of Silicon (LOCOS) process and serve to isolate pixels one from another. A translucent or transparent insulating layer 55 formed over the CMOS image sensor 10 is also illustrated in FIG. 2. Conventional processing methods are used to form, for example, contacts 32 (FIG. 1) in the insulating layer 55 to provide an electrical connection to the source/drain regions 22, the floating diffusion region 25, and other wiring to connect to gates and other connections in the CMOS image sensor 10.

PNP buried photodiodes, such as the pinned photodiode 11 of FIG. 2, are becoming increasingly popular for high efficiency image sensors, particularly for image sensors operating at smaller wavelengths of the visible spectrum, for example, at the blue wavelength. The pinned buried photodiode presents an advantage to a conventional CMOS imager in that it increases the efficiency of charge transfer, improves color response for blue light and decreases dark current (generation of thermally-created electrons that raise potential without any illumination), as described in detail in U.S. Pat. No. 5,181,093 and U.S. Pat. No. 6,297,070, for example.

CMOS imagers with pinned buried photodiodes have a drawback, however, in that the charge is not completely transferred from the photodiode charge collection region 26 to the floating diffusion node 25 due to the formation of various potential barriers at the transfer gate 30. One potential barrier is formed when charge depletes to the pinned (or maximum) potential, at which point the electrostatic potential at the buried charge collection region 26 is higher than the potential at the end of the transfer gate channel adjacent to the buried photodiode. When this occurs, the pinned buried photodiode potential is high enough for some of the electrons to stay back in the photodiode charge collection region 26 rather than to move into the transfer gate 30 and then onto the floating diffusion node 25.

Another potential barrier occurs between the transfer gate 30 and the floating diffusion node 25. After some electrons have been transferred to the floating diffusion node 25, the electrostatic potential of the floating diffusion decreases. This causes a lower potential level at the floating diffusion node end of the transfer gate, such that some of the electrons stay back in the transfer gate channel rather than moving into the floating diffusion node 25. The closing of the potential difference between the floating diffusion node 25 and the channel region under the transfer gate 30 causes backspilling of electrons from the floating diffusion node 25 to the transfer gate channel. This charge stored in the transfer gate channel will be spilled equally into the floating diffusion and the photodiode when the transfer gate is being turned off. However, if channel impurity gradient is present, this charge will be preferably directed into the floating diffusion node when the transfer gate is turned off.

Accordingly, an improved charge transfer between the buried photodiode and the transfer gate, and a subsequent charge transfer between the transfer gate and the floating diffusion node are desirable. An improved charge transfer would improve voltage swing on the floating diffusion made and confer a lower voltage operation. A device that is less likely to form potential barriers would also be more easily manufactured because it would be less sensitive to process variations. By suppressing potential barrier formation in the transfer gate region, backspilling of electrons from the floating diffusion node to the transfer gate channel could be reduced.

A method of fabricating an active pixel photosensor exhibiting these improvements is also needed.

BRIEF SUMMARY OF THE INVENTION

In one aspect, the invention provides a dopant gradient region of a first conductivity type located below an electrically active portion of a transfer gate and adjacent a charge collection region of a second conductivity type of a pinned photodiode. The dopant gradient region comprises a first (low enhancement) doped region of a first dopant concentration and in contact with and laterally displaced from a second (high enhancement) doped region of a second dopant concentration, which is higher than the first dopant concentration. The second (high enhancement) doped region of the dopant gradient region is located adjacent the charge collection region of the pinned photodiode.

In another aspect, the invention provides a potential gradient region corresponding to an impurity or dopant gradient region of a first conductivity type, which is laterally displaced from a charge collection region of a second conductivity type of a buried photodiode and located below a transfer gate of a pixel sensor cell. The potential gradient region has a tailored channel impurity profile below the transfer gate that favors photogenerated electron movement from the charge collection region, through the channel under the transfer gate, and to a floating diffusion node. In this manner, potential barriers at the transfer gate are less likely to form and complete charge transfer is facilitated.

In another aspect, the invention provides a method of providing an improved charge transfer between a buried photodiode and a transfer gate, and a subsequent charge transfer between the transfer gate and a floating diffusion region in a pixel sensor cell. A dopant gradient region is provided below an electrically active portion of a transfer gate of a pixel sensor cell. The doping profile of the dopant gradient region is tailored so that a first (low enhancement implant) doped region of a first conductivity type is formed adjacent and laterally displaced from a second (high enhancement implant) doped region of the first conductivity type. The first (low enhancement implant) doped region has a first dopant concentration, which is lower than the dopant concentration of the second (high enhancement implant) doped region.

In one embodiment, a low enhancement implant is first conducted to implant dopants of the first conductivity type in an area of a substrate below the transfer gate and to form a low enhancement doped region of the first dopant concentration. A second high enhancement implant is then conducted to implant dopants of the first conductivity type in at least a portion of the doped region having the first dopant concentration, and to form therefore a first (low enhancement implant) doped region of the first dopant concentration, and a second (high enhancement implant) doped region of the second dopant concentration, which is higher than the first dopant concentration. The second (high enhancement implant) doped region is adjacent a charge collection region of a second conductivity type of a pinned photodiode.

In another embodiment, a high enhancement implant is first conducted to implant dopants of a first conductivity type in an area of a substrate (and possibly into the whole wafer) below the transfer gate and to form a highly doped region of a second dopant concentration. A second implant is subsequently conducted to implant dopants of a second conductivity type in at least a portion of the highly doped region having the second dopant concentration. By implanting impurity atoms of the second conductivity type, the second dopant concentration of the highly doped region is partially offset by the impurity atoms, forming therefore a first (low enhancement implant) doped region of a first dopant concentration which is smaller that the second dopant concentration and an adjacent second (high enhancement implant) doped region of the second dopant concentration. A charge collection region of a second conductivity type of a pinned photodiode is formed adjacent the second doped region of the dopant gradient region.

By providing a lateral impurity gradient and a corresponding potential gradient that favors photogenerated electron movement from the charge collection region of the photodiode, through the channel under the transfer gate, and to a floating diffusion node, potential barriers are less likely to form and complete charge transfer is facilitated while lower voltage operation in facilitated.

These and other features and advantages of the invention will be more apparent from the following detailed description that is provided in connection with the accompanying drawings and illustrated exemplary embodiments of the invention.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but could be based on silicon-germanium, germanium, or gallium arsenide, among others.

The term "pixel" refers to a picture element unit cell containing a photosensor and transistors for converting electromagnetic radiation to an electrical signal. For purposes of illustration, a representative pixel is illustrated in the figures and description herein and, typically, fabrication of all pixels in an imager will proceed simultaneously in a similar fashion.

Figure 14:
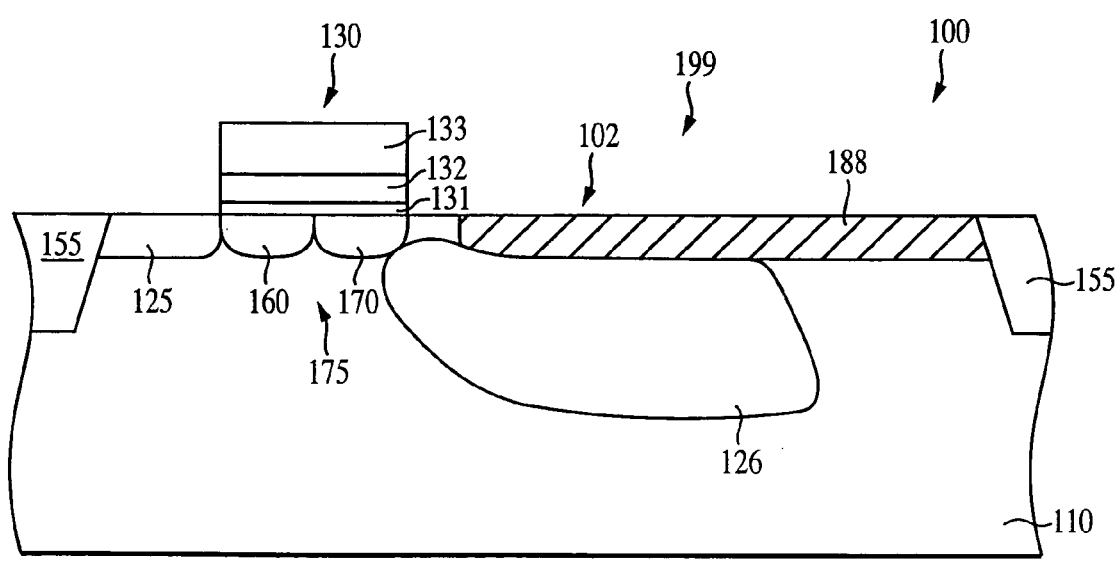
FIG. 14 is a schematic cross-sectional view of a CMOS image sensor pixel of FIG. 3 at a stage of processing subsequent to that shown in FIG. 13.
Figure 19:
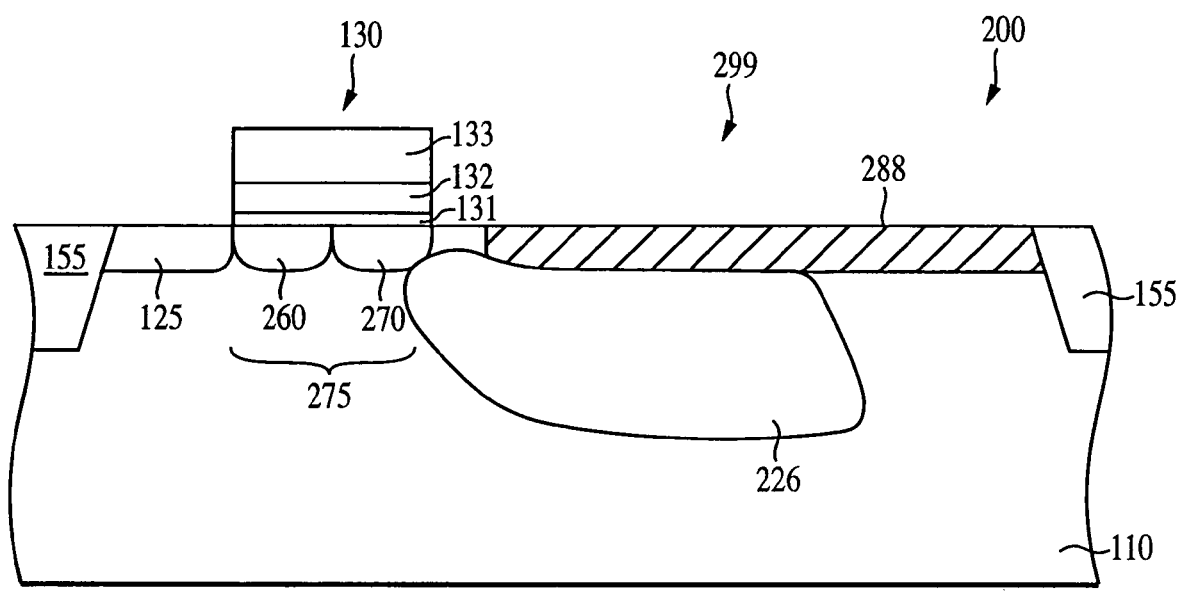
FIG. 19 is a schematic cross-sectional view of a CMOS image sensor pixel of FIG. 15 at a stage of processing subsequent to that shown in FIG. 18.

Referring now to the drawings, where like elements are designated by like reference numerals, FIGS. 14 and 19 illustrate two exemplary embodiments of pixel sensor cells 100 (FIG. 14) and 200 (FIG. 19) having respective dopant gradient regions 175, 275 below an active area of a gate structure 130 and laterally displaced from respective charge collection regions 126, 226 of pinned buried photodiodes 199, 299.

Figure 1:
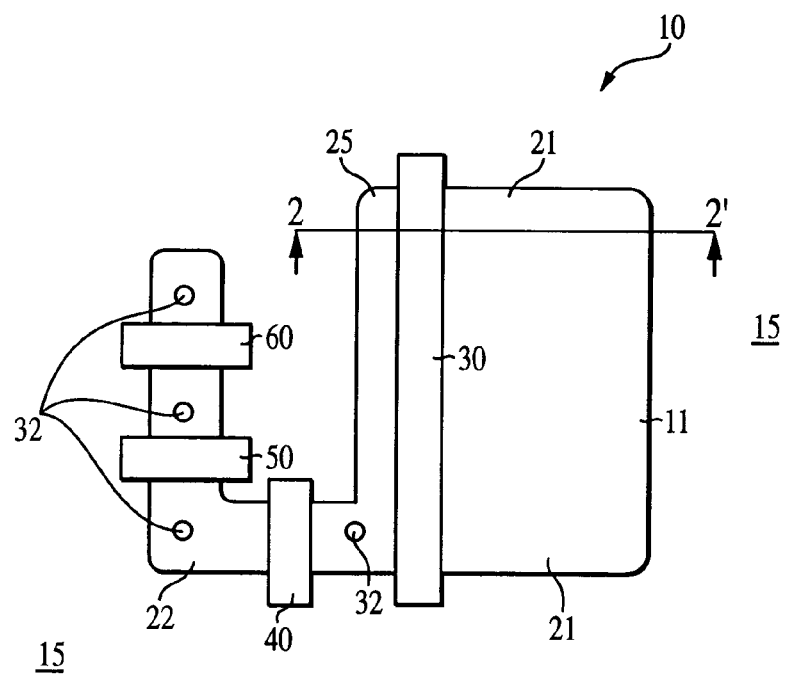
FIG. 1 is a top plan view of an exemplary CMOS image sensor pixel.
Figure 2:
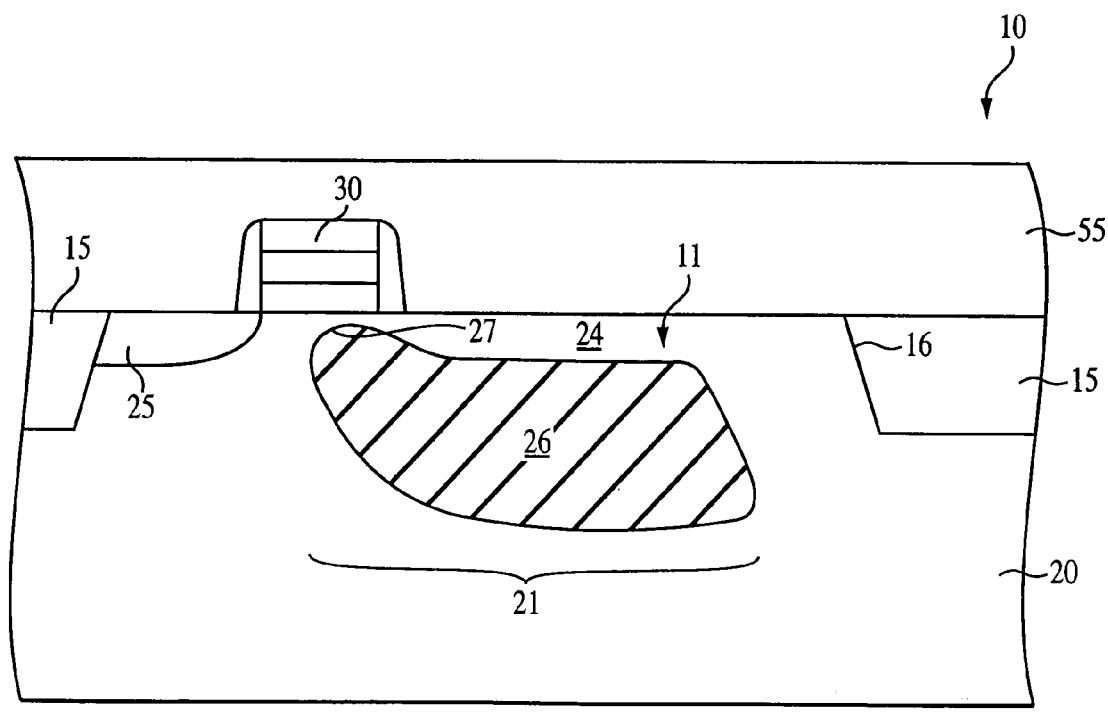
FIG. 2 is a schematic cross-sectional view of the CMOS image sensor of FIG. 1 taken along line 2-2'.
Figure 3:
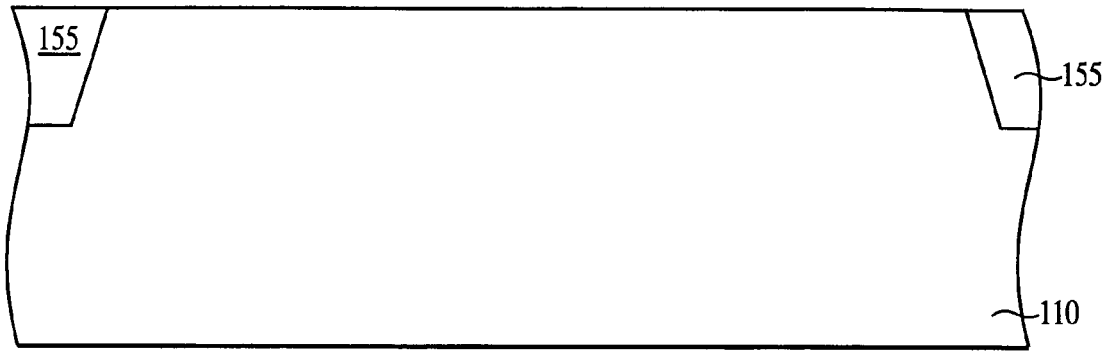
FIG. 3 is a schematic cross-sectional view of a CMOS image sensor pixel illustrating the fabrication of a charge transfer region between a pinned photodiode and an adjacent gate structure, in accordance with the present invention and at an initial stage of processing.

One exemplary process for fabricating the structures illustrated in FIG. 14 will now be described with reference to FIGS. 3-14. FIG. 3 illustrates a substrate 110 along a cross-sectional view which is the same view as in FIG. 2. For exemplary purposes, the substrate 110 is a silicon substrate slightly doped with a dopant of a first conductivity type, which for exemplary purposes, is p-type. However, as noted above, the invention has equal application to other semiconductor substrates. The dopant concentration in the p-type silicon substrate 110 is within the range of about $1 \times 10^{11}$ to about $1 \times 10^{13}$ atoms per cm$^3$, and is preferably within the range of about $1 \times 10^{12}$ to about $5 \times 10^{12}$ atoms per cm$^3$.

FIG. 3 also illustrates isolation regions 155 which are formed within the substrate 110 and are filled with a dielectric material, which may be an oxide material, for example a silicon oxide such as SiO or SiO$_2$, oxynitride, a nitride material such as silicon nitride, silicon carbide, a high temperature polymer, or other suitable dielectric materials. In a preferred embodiment, however, the isolation regions 155 are shallow trench isolation regions and the dielectric material is a high density plasma (HDP) oxide, a material which has a high ability to effectively fill narrow trenches. Thus, for simplicity, reference to the isolation regions 155 will be made in this application as to the shallow trench isolation regions 155. The shallow trench isolation regions 155 have a depth of about 1,000 to about 4,000 Angstroms, more preferably of about 2,000 Angstroms.

A doped layer or well (not shown) of a first conductivity type, which for exemplary purposes is p-type, may be formed within the substrate 110 by implanting p-type dopants in the area of the substrate directly beneath the active area of the pixel cell. The p-type well may be formed subsequent or prior to the formation of the shallow trench isolation (STI) 155. The dopant concentration in the p-type well is within the range of about $1*10^{13}$ to about $1*10^{17}$ atoms per cm$^3$, and is preferably within the range of about $1*10^{14}$ to about $5*10^{15}$ atoms per cm$^3$.

Figure 4:
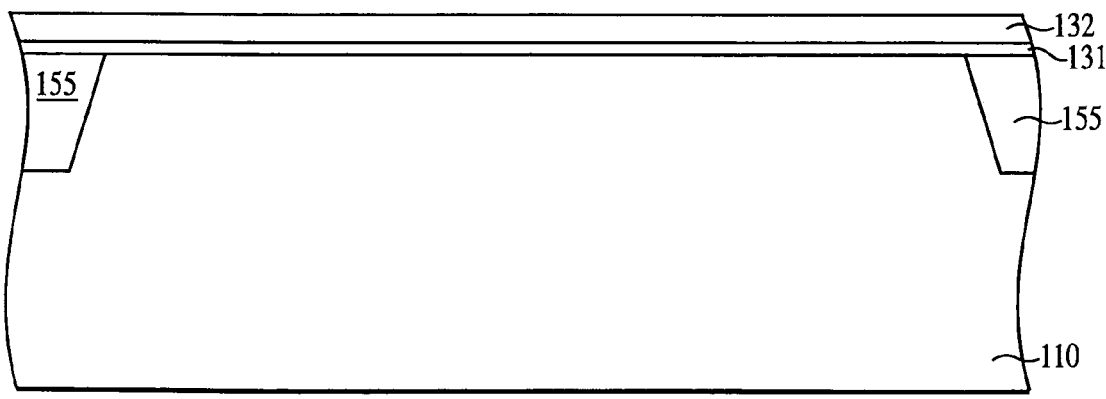
FIG. 4 is a schematic cross-sectional view of a CMOS image sensor fragment of FIG. 3 at a stage of processing subsequent to that shown in FIG. 3.
Figure 10:
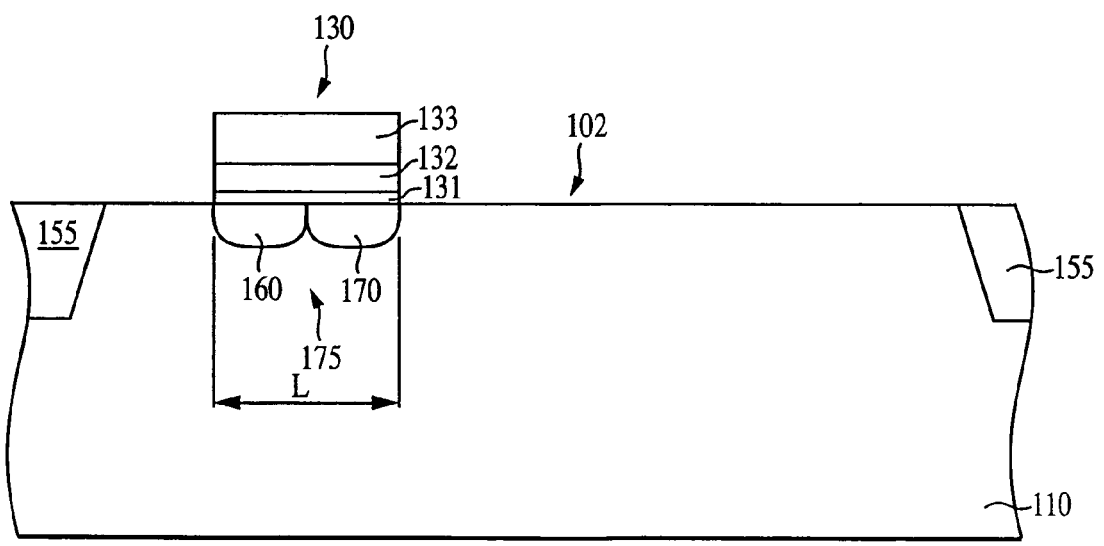
FIG. 10 is a schematic cross-sectional view of a CMOS image sensor pixel of FIG. 3 at a stage of processing subsequent to that shown in FIG. 9.

Referring now to FIG. 4, a first gate oxide layer 131 of grown or deposited silicon oxide and a conductive layer 132 are sequentially formed over the silicon substrate 110. As described in detail below, the first gate oxide layer 131 and the conductive layer 132 will be part of a multi-layered transfer gate stack 130 (FIG. 10). The first oxide layer 131 and the conductive layer 132 may be formed by conventional deposition methods, for example, chemical vapor deposition (CVD) or plasma enhanced chemical vapor deposition (PECVD), among many others.

In addition and if desired, a silicide layer (not shown) may be also formed over the conductive layer 132 and as part of the subsequently formed gate stack 130 (FIG. 10). Advantageously, the gate structures of all other transistors in the imager circuit design may have this additionally formed silicide layer. This silicide layer may be titanium silicide, tungsten silicide, cobalt silicide, molybdenum silicide, or tantalum silicide. This added conductive layer could also be a barrier layer/refractory metal such as TiN/W or $WN_x$/W or it could be entirely formed of $WN_x$.

Figure 5:
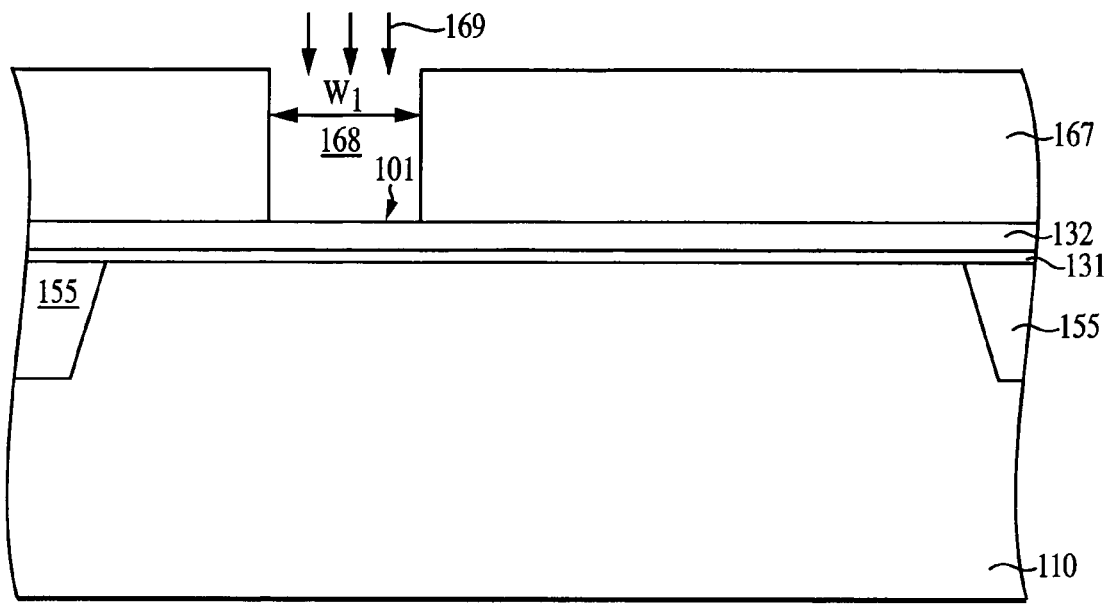
FIG. 5 is a schematic cross-sectional view of a CMOS image sensor pixel of FIG. 3 at a stage of processing subsequent to that shown in FIG. 4.

Subsequent to the formation of the STI regions 155, the gate oxide layer 131 and the conductive layer 132, a first photoresist layer 167 is next formed over the structure of FIG. 4 to a thickness of about 1,000 Angstroms to about 20,000 Angstroms, as illustrated in FIG. 5. The first photoresist layer 167 is patterned to obtain a first opening 168 over an area 101 of the substrate 110 where a doped gradient region will be formed below a transfer gate stack, in accordance with an embodiment of the present invention. As illustrated in FIG. 5, the first photoresist layer 167 is patterned so that first opening 168 is formed within the first photoresist layer 177 to a width "$W_1$" of about 500 Angstroms to about 10,000 Angstroms, more preferably of about 5,000 Angstroms. The width $W_1$ of the first opening 168 represents the channel length L of the transfer gate 130 (FIG. 10), formed as described below.

Figure 6:
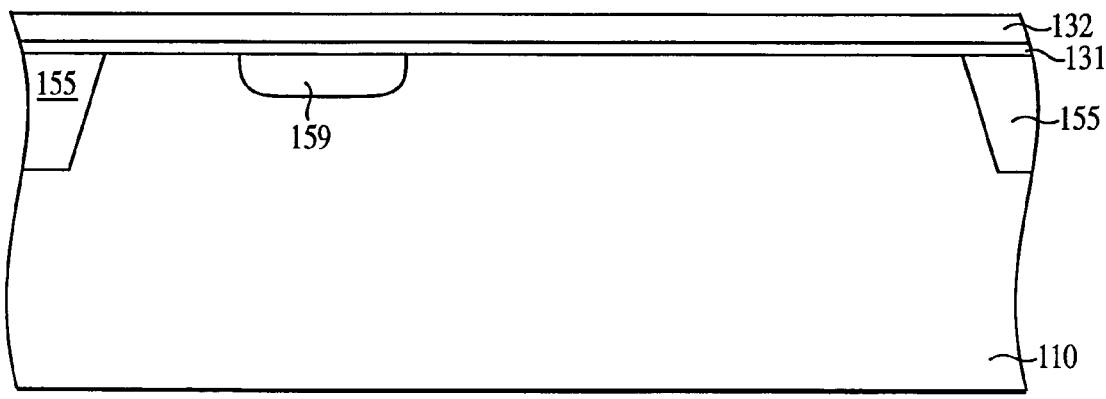
FIG. 6 is a schematic cross-sectional view of a CMOS image sensor pixel of FIG. 3 at a stage of processing subsequent to that shown in FIG. 5.

A first low enhancement implantation 169 (FIG. 5) using a dopant of a first conductivity type, which for exemplary purposes is p-type, is conducted to implant ions through the first opening 168 (FIG. 5) in the area 101 of the substrate 110 to form a doped p-type low enhancement region 159, as shown in FIG. 6. Ion implantation may be conducted by placing the substrate 110 in an ion implanter, and implanting appropriate p-type dopant ions through the first opening 168 (FIG. 5) into the substrate 110 at an energy of 100 keV to 5 MeV to form the low enhancement doped region 159. P-type dopants, such as boron, beryllium, indium or magnesium, may be employed for the first low enhancement implant. The dopant concentration in the low enhancement doped region 159 (FIG. 6) is within the range of about $1\times10^{16}$ to about $1\times10^{19}$ atoms per $cm^3$, more preferably of about $1\times10^{17}$ to about $1\times10^{18}$ atoms per $cm^3$.

Subsequent to the first low enhancement implantation 169 (FIG. 5), the first photoresist layer 167 is removed by conventional techniques, such as oxygen plasma for example. The structure at this point is depicted in FIG. 6.

A second photoresist layer 177 (FIG. 7) is next formed over the conductive layer 132 to a thickness of about 1,000 Angstroms to about 20,000 Angstroms. The second photoresist layer 177 (FIG. 7) is patterned with a mask to obtain a second opening 178 having a width "$W_2$" which is smaller than the width $W_1$ of the first opening 168. Preferably, the width $W_2$ of the second opening 178 is about half the width $W_1$. Although the embodiments below will be described with reference to the second opening 178 having width $W_2$ about half of the width $W_1$ to allow a subsequent implantation of about half of the low enhancement doped region 159, the invention is not limited to this embodiment. Accordingly, it must be understood that the invention also contemplates the formation of the second opening 178 having various widths to allow for the subsequent implantation of corresponding various portions of the low enhancement doped region 159.

Figure 7:
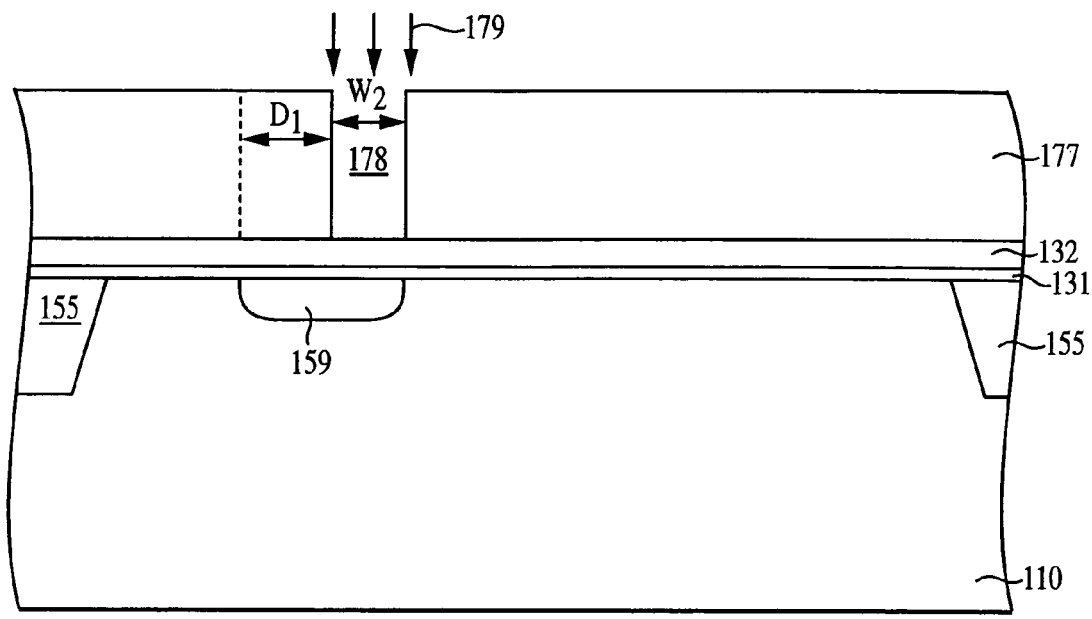
FIG. 7 is a schematic cross-sectional view of a CMOS image sensor pixel of FIG. 3 at a stage of processing subsequent to that shown in FIG. 6.

The second photoresist layer 177 (FIG. 7) is patterned so that, on one side of the second opening 178, the second photoresist layer 177 is approximately coincident with the edge of the low enhancement doped region 159 located adjacent to a substrate area where a photodiode is to be formed (the right edge of doped region 159 in FIG. 7). On the other side of the second opening 178, the second photoresist layer 177 extends over the doped region 159 by an offset distance $D_1$ (FIG. 7), which is the difference between $W_1$ and $W_2$. Preferably, the offset distance $D_1$ (FIG. 7) is about half of the width $W_1$ (FIG. 5) of the first opening 168 and of the channel length L (FIG. 10). Accordingly, the offset distance $D_1$ (FIG. 7) may be of about 250 Angstroms to about 1,000 Angstroms, more preferably of about 500 Angstroms.

Subsequent to the formation of the second opening 178 (FIG. 7), a second dopant implantation 179 (FIG. 7) using a dopant of the first conductivity type which, as noted above, for exemplary purposes is p-type, is conducted to implant ions through the second opening 178 in at least a portion of the low enhancement doped region 159 of the substrate 110, more preferably in about half the low enhancement doped region 159, to form a first low enhancement region 160, having a first dopant concentration, and a second high enhancement doped region 170, having a second dopant concentration.

Figure 8:
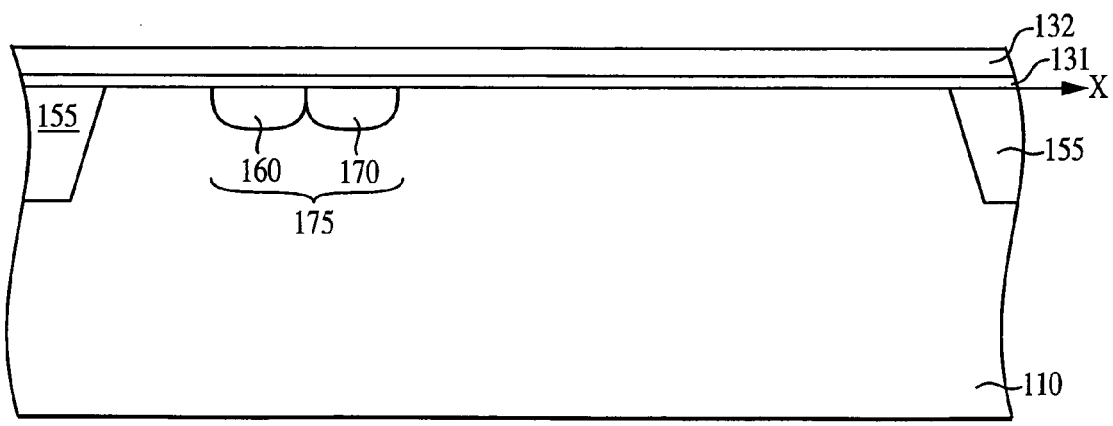
FIG. 8 is a schematic cross-sectional view of a CMOS image sensor pixel of FIG. 3 at a stage of processing subsequent to that shown in FIG. 7.

The first dopant concentration is similar to the dopant concentration of the low enhancement doped region 159 (FIG. 7); however, the second dopant concentration is higher than the dopant concentration of the low enhancement doped region 159. The first and second doped regions 160, 170 form a dopant gradient region 175, as shown in FIG. 8. The dopant gradient region 175 is a non-uniformly doped region, which for the purposes of the present invention is defined as a region having at least two different doping concentration in the X direction of the (x, y) plane.

Ion implantation may be conducted by placing the substrate 110 in an ion implanter, and implanting appropriate p-type dopant ions through the second opening 178 (FIG. 7) into the low enhancement doped region 159 of the substrate 110 at an energy of 100 keV to 5 MeV to form second high enhancement doped region 170 of the doped gradient region 175 (FIG. 8). P-type dopants, such as boron, beryllium, indium or magnesium, may be employed for the second implant. The dopant concentration in the second high enhancement doped region 170 (FIG. 8) is preferably twice the first dopant concentration of the low enhancement doped region 159 and of the corresponding first doped region 160. Thus, the dopant concentration in the second high enhancement doped region 170 (FIG. 8) is within the range of about $2\times10^{16}$ to about $2\times10^{19}$ atoms per $cm^3$, more preferably of about $2\times10^{17}$ to about $2\times10^{18}$ atoms per $cm^3$. However, it must be understood that the invention contemplates embodiments in which the second concentration is only greater than the first dopant concentration, without necessarily being twice its value.

Figure 9:
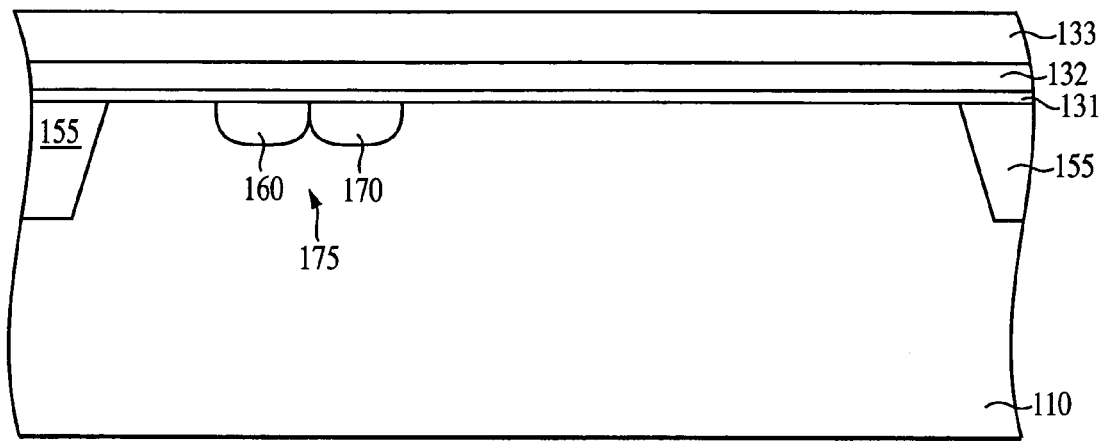
FIG. 9 is a schematic cross-sectional view of a CMOS image sensor pixel of FIG. 3 at a stage of processing subsequent to that shown in FIG. 8.

Subsequent to the formation of the doped gradient region 175 (FIG. 8), an insulating layer 133 is next formed over the conductive layer 132 and the gate oxide layer 131, as shown in FIG. 9, to complete the formation of the stack of layers which will subsequently be part of transfer gate stack 130 (FIG. 10). The insulating layer 133 may be preferably an oxide, such as silicon dioxide, silicon nitride, silicon oxynitride, ON, NO, ONO or TEOS, among others. The insulating layer 133 may be formed by a deposition method and to a thickness of about 100 Angstroms to about 1,500 Angstroms, more preferably of about 400 Angstroms to about 1,000 Angstroms. The gate oxide layer 131, the conductive layer 132 and the insulating layer 133 are patterned and etched by conventional methods of the art to form transfer gate stack 130, as illustrated in FIG. 10.

FIGS. 11-14 illustrate the formation of a buried p-n-p photodiode 199 (FIG. 14) having an n-type doped region 126 (FIG. 14) formed adjacent the second high enhancement doped region 170 of the doped gradient region 175 of the present invention.

Figure 11:
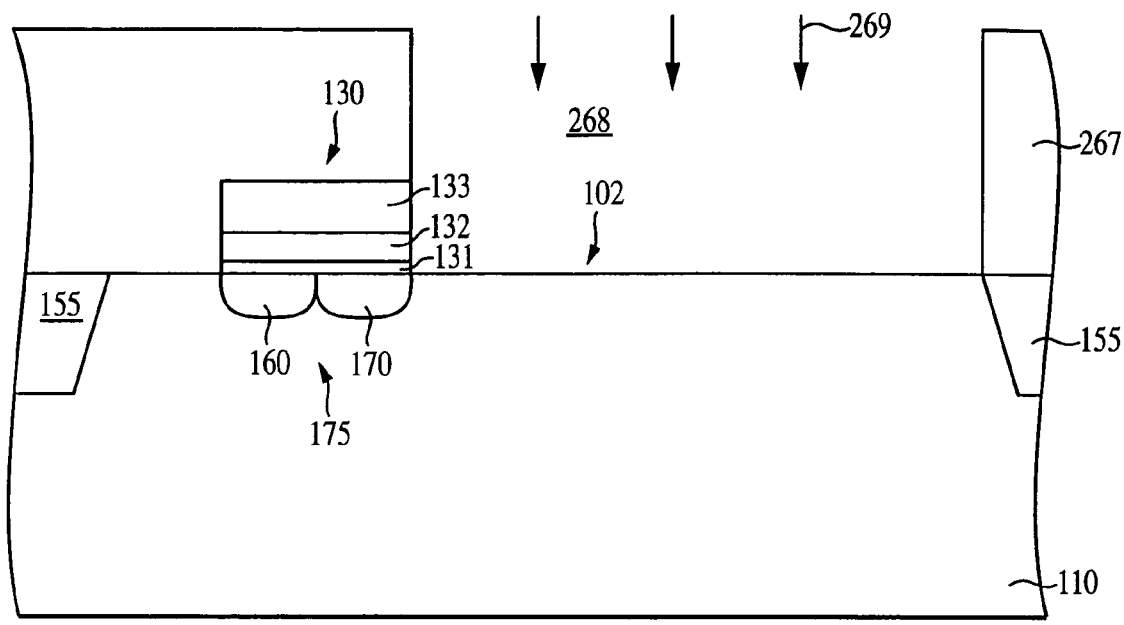
FIG. 11 is a schematic cross-sectional view of a CMOS image sensor pixel of FIG. 3 at a stage of processing subsequent to that shown in FIG. 10.

Referring now to FIG. 11, a third photoresist layer 267 is next formed over the substrate 110 including the gate stack 130 to a thickness of about 1,000 Angstroms to about 20,000 Angstroms. The third photoresist layer 267 (FIG. 11) is patterned with a mask to obtain a third opening 268 over a photodiode area 102 (FIG. 11) of the substrate 110 between about the edge of the gate structure 130 and the isolation region 155, where a charge accumulation region is to be formed. The third photoresist layer 267 is patterned so that, on one side of the third opening 268, the third photoresist layer 267 is approximately coincident with the edge of the transfer gate 130. On the other side of the third opening 268, the third photoresist layer 267 is approximately coincident with the edge of the STI region 155 (the right most STI region 155 in FIG. 11).

Figure 12:
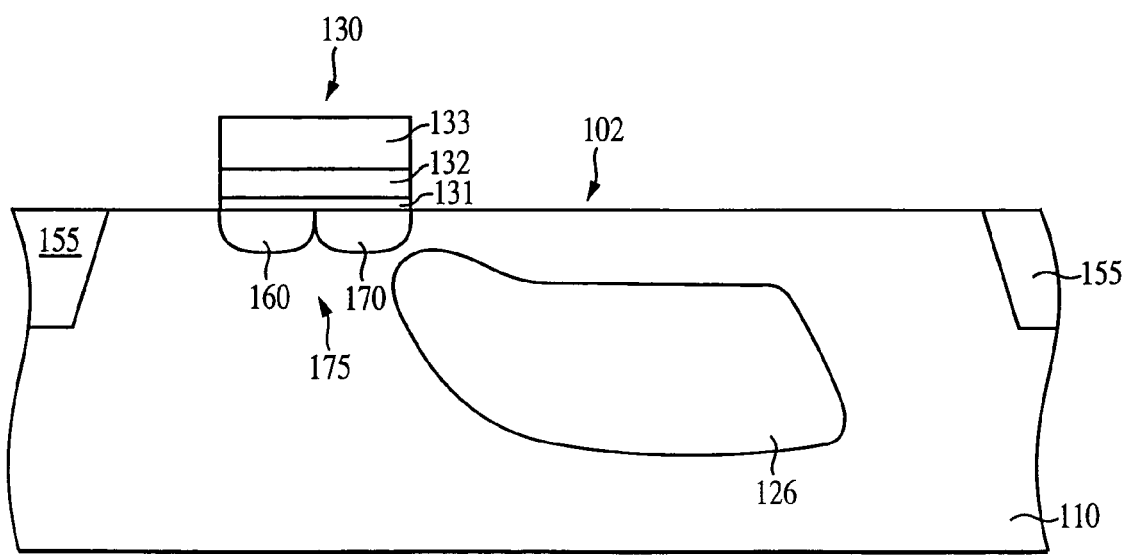
FIG. 12 is a schematic cross-sectional view of a CMOS image sensor pixel of FIG. 3 at a stage of processing subsequent to that shown in FIG. 11.

A third dopant implantation 269 (FIG. 11) using a dopant of a second conductivity type, which for exemplary purposes is n-type, is conducted to implant ions through the third opening 268 (FIG. 11) in the photodiode area 102 of the substrate 110 directly beneath the active area of the pixel cell to form an n-type region 126, as illustrated in FIG. 12. The implanted n-doped region 126 is adjacent the edge of the transfer gate 130 and adjacent and laterally displaced from the second high enhancement doped region 170 of the doped gradient region 175. The implanted n-doped region 126 forms a photosensitive charge collection region for collecting photogenerated electrons.

The third ion implantation 269 (FIG. 11) may be conducted by placing the substrate 110 in an ion implanter, and implanting appropriate n-type dopant ions through the third opening 268 (FIG. 11) into the substrate 110 at an energy of 100 keV to 5 MeV to form n-doped region 126. N-type dopants such as arsenic, antimony, or phosphorous may be implanted straight into the substrate 110, or at an angle different than a 90 degree angle relative to the gate structure 130 and in the (x, y) plane, for example. The dopant concentration in the n-doped region 126 (FIG. 12) is within the range of about $5 \times 10^{14}$ to about $1 \times 10^{18}$ atoms per cm$^3$, and is preferably within the range of about $1 \times 10^{15}$ to about $5 \times 10^{16}$ atoms per cm$^3$. If desired, multiple implants may be also used to tailor the profile of the n-doped region 126. The implants forming region 126 may also be angled implants formed by angling the direction of implants 269 toward the transfer gate 130.

Subsequent to the third implant 269 (FIG. 11), the third photoresist layer 267 is removed by conventional techniques, such as oxygen plasma for example. The structure at this point is depicted in FIG. 12.

A fourth photoresist layer 277 (FIG. 13) is next formed over the substrate 110 and the transfer gate 130 to a thickness of about 1,000 Angstroms to about 20,000 Angstroms. The fourth photoresist layer 277 (FIG. 13) is patterned with a mask to obtain a fourth opening 278. The fourth photoresist layer 277 is patterned so that, on one side of the fourth opening 278, the fourth photoresist layer 277 completely covers the transfer gate 130 and extends over the photodiode area 102 by a predetermined distance "d" (FIG. 11) of about 300 Angstroms to about 1,000 Angstroms. On the other side of the fourth opening 278, the fourth photoresist layer 277 is approximately coincident with the edge of the STI region 155 (the right most STI region 155 in FIG. 11).

A fourth dopant implantation 279 (FIG. 13) using a dopant of the first conductivity type, which for exemplary purposes is p-type, is conducted to implant ions through the fourth opening 278 (FIG. 13), in the area of the substrate directly beneath the active area of the pixel cell and laterally displaced from the gate stack 130 by distance "d" to form a p-type pinned surface layer 188, as illustrated in FIG. 14. As shown in FIG. 14, the implanted p-type pinned surface layer 188 is aligned to, and contacts, the edge of the isolation region 155 and is displaced laterally from the gate stack 130 by offset distance "d."

The fourth dopant implantation may be conducted by placing the substrate 110 in an ion implanter, and implanting appropriate p-type dopant ions through the fourth opening 278 (FIG. 13) into the substrate 110 at an energy of 100 keV to 5 MeV to form the p-type pinned surface layer 188. P-type dopants, such as boron, beryllium, indium or magnesium, may be employed for the second implant. The dopant concentration in the p-type pinned surface layer 188 (FIG. 14) is within the range of about $1 \times 10^{17}$ to about $1 \times 10^{20}$ atoms per cm$^3$.

Figure 13:
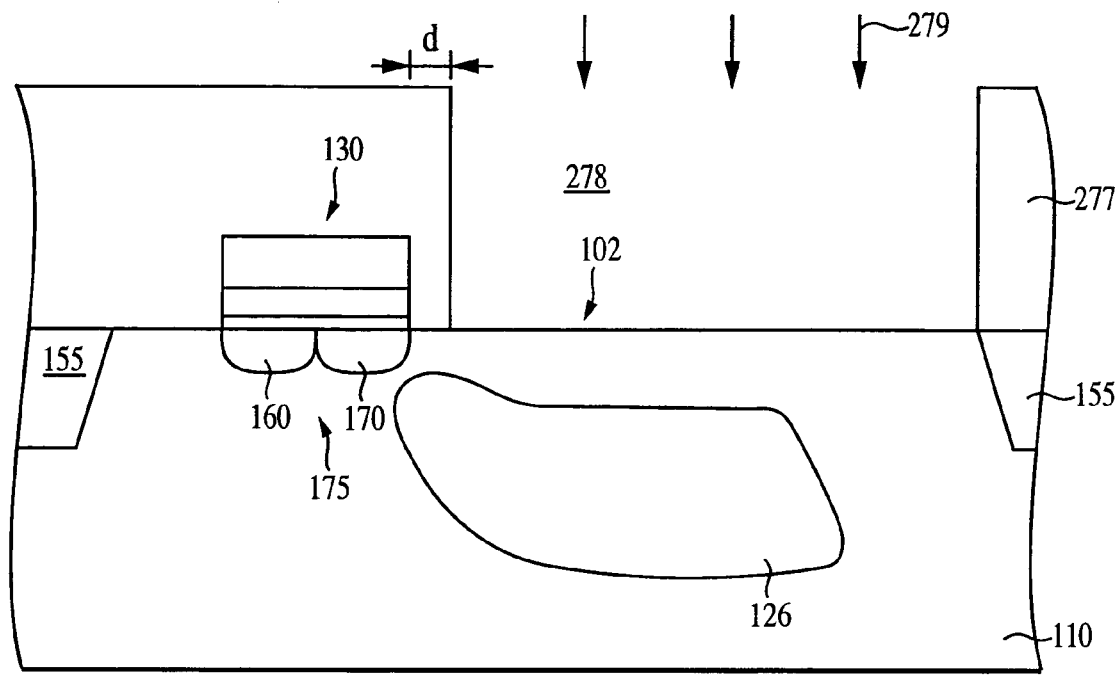
FIG. 13 is a schematic cross-sectional view of a CMOS image sensor pixel of FIG. 3 at a stage of processing subsequent to that shown in FIG. 12.

Subsequent to the fourth implant 279 of FIG. 13, the fourth photoresist layer 277 is removed by conventional techniques, such as oxygen plasma, for example, to complete the formation of p-n-p photodiode 199 formed by regions 188, 126 and p-type doped substrate 110 and adjacent the second high enhancement doped region 170, as illustrated in FIG. 14. A floating diffusion region 125 is also formed opposite the charge collection region 126 and adjacent the first low enhancement doped region 160 of the doped gradient region 175 by known methods in the art.

The combination of the low enhancement implant region 160, formed below and at one end of the transfer gate 130, and the high enhancement implant region 170, formed below and at the other end of the transfer gate 130, creates an impurity gradient and a monotonous potential increase from the n-type photodiode region 126 to the transfer gate 130 and to the floating diffusion node 125. The lower enhancement implant region 160 translates into an electrostatic potential under the transfer gate 130 that is slightly higher than that of the pinned potential of the buried n-type doped region 126. The higher enhancement implant region 170 translates into an electrostatic potential under the gate 130 that is slightly lower than that of the floating diffusion node 125, but that is still higher than that of the lower enhancement implant region 160. Overall, there is an impurity gradient across the entire channel under the transfer gate 130, from the buried n-type photodiode region 126 to the low enhancement implant region 160 to the high enhancement implant region 170 and into the floating diffusion node 125.

The impurity gradient along the entire path from the buried n-type region 126 to the floating diffusion node 125 facilitates complete charge transfer. The lower enhancement dose of the low enhancement implant region 160 helps it go to high enough potential to insure complete electron transfer from the buried n-type photodiode region 126 into the transfer gate 130 and then to the floating diffusion node 125. The higher enhancement dose of the high enhancement implant region 170 works against electron backspilling from the floating diffusion node 125 into the transfer gate 130.

In addition, the potential difference between the low enhancement implant region 160 and the high enhancement implant region 170 creates a lateral electric field under transfer gate 130 that favors electron transfer into the floating diffusion node 125. This lateral electric field also makes potential barriers less likely to form. As a result, the pixel sensor cell 100 has increased manufacturability because it is less sensitive to process variation with respect to monotonous potential increase from the n-type doped region 126 to the floating diffusion node 125.

Since the magnitude of floating diffusion voltage swing is limited by formation of potential barriers preventing charge transfer from the n-type doped region 126 to the floating diffusion node 125, a built-in potential in transfer gate 130 also helps increase voltage swing on floating diffusion node 125 by suppressing potential barrier formation. The channel impurity gradient corresponding to the dopant gradient region 175 provides, therefore, a device with better charge transfer compared to that of the conventional device when operating voltage is scaled down. For implant concentrations of the preferred embodiment described above, the present invention operates with complete charge transfer at a voltage of about 2.7V to about 3.3V.

The devices of the pixel sensor cell 100 including the reset transistor, the source follower transistor and row select transistor are formed by well-known methods. Conventional processing steps may be also employed to form contacts and wiring to connect gate lines and other connections in the pixel cell 100. For example, the entire surface may be covered with a passivation layer of, e.g., silicon dioxide, BSG, PSG, or BPSG, which is CMP planarized and etched to provide contact holes, which are then metallized to provide contacts to the reset gate, transfer gate and other pixel gate structures, as needed. Conventional multiple layers of conductors and insulators to other circuit structures may also be used to interconnect the structures of the pixel sensor cell.

Figure 15:
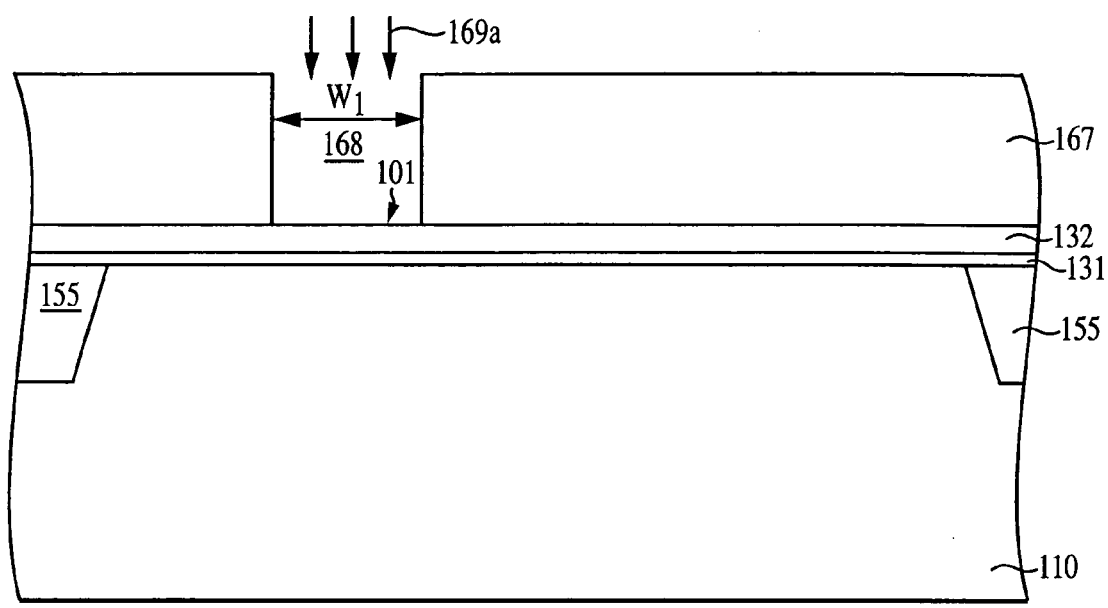
FIG. 15 is a schematic cross-sectional view of a CMOS image sensor pixel of FIG. 4 at a stage of processing subsequent to that shown in FIG. 4 and in accordance with another embodiment of the present invention.

FIGS. 15-19 illustrate yet another embodiment of the present invention according to which dopant gradient region 275 (FIG. 18) is formed by first implanting dopants of a first conductivity type to form a highly doped region below the transfer gate and then offsetting the concentration of at least a predetermined portion of the highly doped region by implanting dopants of a second conductivity type into the predetermined portion of the highly doped region. The structure of FIG. 15 is similar in part to the structure of FIG. 5 to the extent that the first dopant implantation 169 of the first embodiment is substituted with a fifth dopant implantation 169a which is conducted at an energy higher than that of the first dopant implantation 169.

Figure 16:
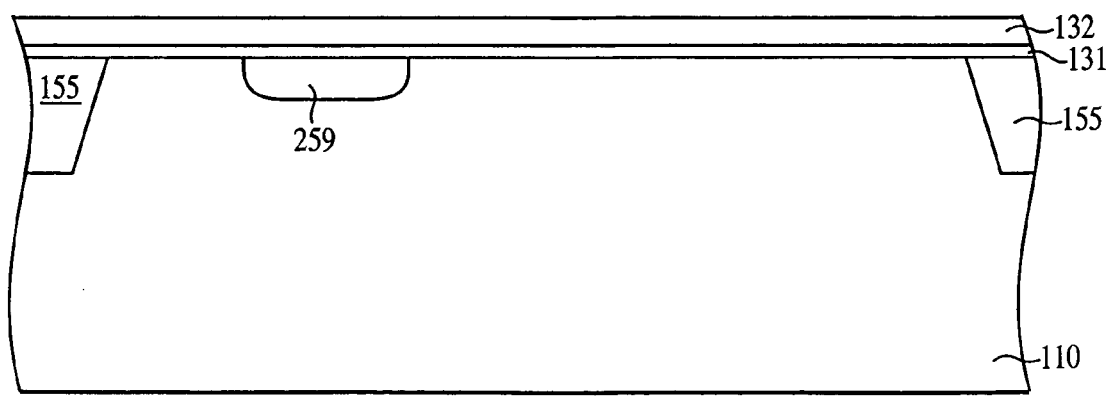
FIG. 16 is a schematic cross-sectional view of a CMOS image sensor pixel of FIG. 15 at a stage of processing subsequent to that shown in FIG. 15.

As in the previously described embodiment, ion implantation may be conducted by placing the substrate 110 in an ion implanter, and implanting appropriate p-type dopant ions through the opening 168 (FIG. 15) into area 101 of the substrate 110 at an energy of 100 keV to 5 MeV to form a highly doped region 259, as shown in FIG. 16. P-type dopants, such as boron, beryllium, indium or magnesium, may be employed for the fifth implant 169a. The dopant concentration in the highly doped region 259 is within the range of about $2 \times 10^{16}$ to about $2 \times 10^{19}$ atoms per $cm^3$, more preferably of about $2 \times 10^{17}$ to about $2 \times 10^{18}$ atoms per $cm^3$.

Subsequent to the formation of the highly doped region 259, photoresist layer 177 (FIG. 17) is next formed over the conductive layer 132 to a thickness of about 1,000 Angstroms to about 20,000 Angstroms. The photoresist layer 177 (FIG. 17) is patterned with a mask to obtain opening 178 so that, on one side of the opening 178, the photoresist layer 177 is approximately coincident with the edge of the highly doped region 259. On the other side of the opening 178, which is located adjacent to a substrate area where a photodiode is to be formed, the photoresist layer 177 extends over the highly doped region 259 by an offset distance $D_2$ (FIG. 17) which is smaller than the width $W_1$ (FIG. 15) of the opening 168, and preferably about half of the width $W_1$. The offset distance $D_2$ (FIG. 17) may be of about 100 Angstroms to about 500 Angstroms, more preferably of about 250 Angstroms.

Figure 17:
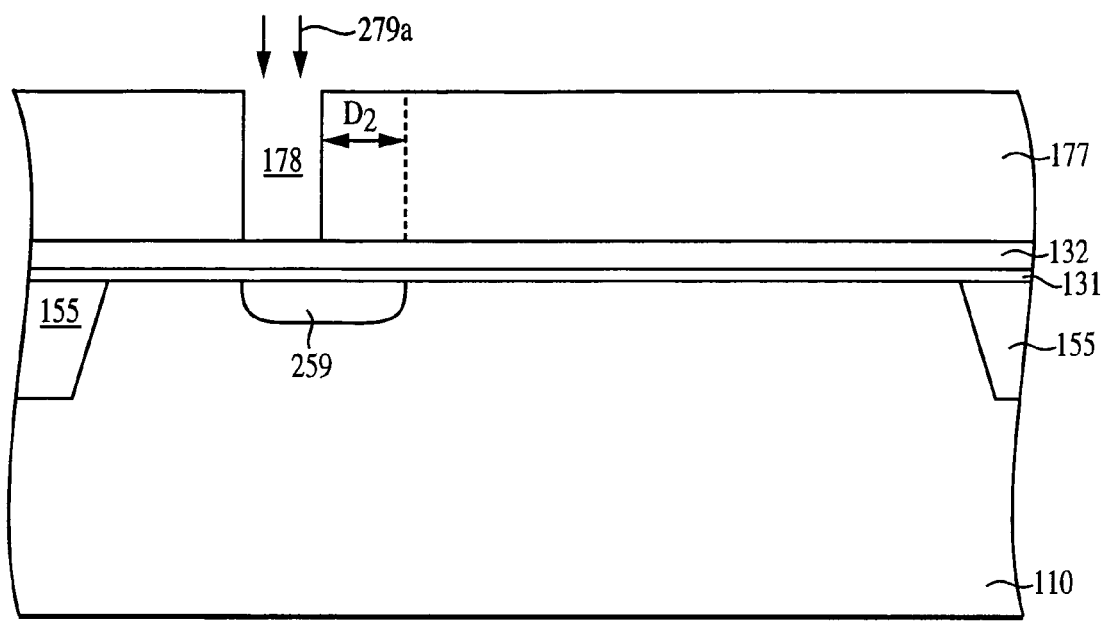
FIG. 17 is a schematic cross-sectional view of a CMOS image sensor pixel of FIG. 15 at a stage of processing subsequent to that shown in FIG. 16.
Figure 18:
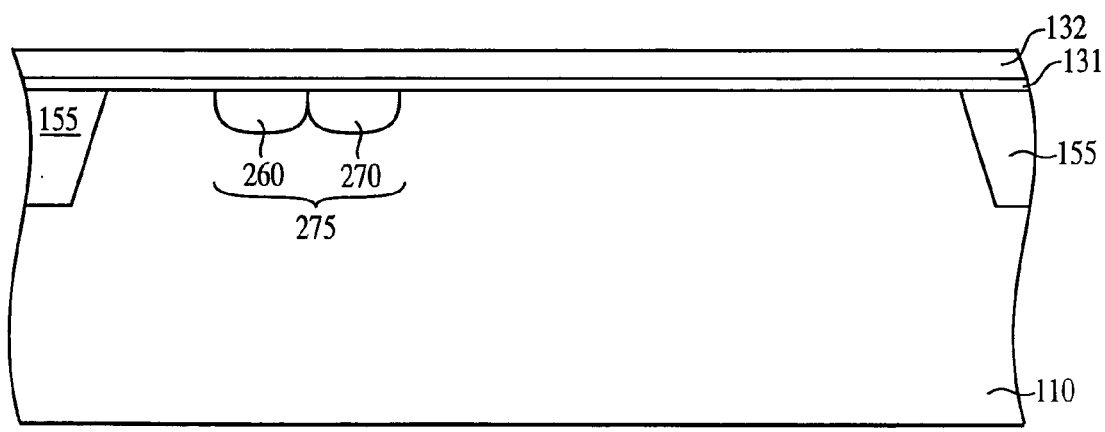
FIG. 18 is a schematic cross-sectional view of a CMOS image sensor pixel of FIG. 15 at a stage of processing subsequent to that shown in FIG. 17.

Subsequent to the formation of the opening 178, a sixth dopant implantation 279a (FIG. 17) using a dopant of the second conductivity type which, for exemplary purposes is n-type, is conducted to implant ions through the opening 178 in at least a portion of the highly doped region 259 of the substrate 110, more preferably in about half of the highly doped region 259, to form a first low enhancement region 260, having a first dopant concentration, and a second high enhancement doped region 270, having a second dopant concentration. The first dopant concentration is lower than the dopant concentration of the highly doped region 259 (FIG. 17) and the second dopant concentrations is similar to the dopant concentration of the highly doped region 259 (FIG. 17). The first and second doped regions 260, 270 form dopant gradient region 275, as shown in FIG. 18.

To form the first low enhancement region 260 (FIG. 18), the substrate 110 is placed in an ion implanter and appropriate n-type dopant ions are implanted through the opening 178 (FIG. 17) into at least a portion of the doped region 259 of the substrate 110 at an energy of 100 keV to 5 MeV. N-type dopants, such as arsenic, antimony, or phosphorous, may be employed for the sixth implant. By implanting n-type impurity atoms into the p-type doped region 259, the dopant concentration in the first doped region 260 (FIG. 18) is decreased compared to the dopant concentration of the second doped region 270, which is the same as that of the highly doped region 259. Thus, the dopant concentration in the first low enhancement doped region 260 (FIG. 18) becomes within the range of about $1 \times 10^{16}$ to about $1 \times 10^{19}$ atoms per $cm^3$, more preferably of about $1 \times 10^{17}$ to about $1 \times 10^{18}$ atoms per $cm^3$.

Subsequent to the formation of the dopant gradient region 275, transfer gate structure 130, n-type implanted region 226 and adjacent pinned layer 288 of photodiode 299 are formed by a method similar to that described above for the formation of the n-type implanted region 126 and of the adjacent pinned layer 188 of photodiode 199, with reference to FIGS. 11-14.

Although the above embodiments have been described with reference to the formation of a p-type doped gradient region, such as the p-type doped gradient regions 175 (FIG. 8) and 275 (FIG. 18) adjacent a buried p-n-p photodiode, such as the p-n-p photodiodes 199 (FIG. 14) and 299 (FIG. 19), it must be understood that the invention is not limited to this embodiment. Accordingly, the invention has equal applicability to an n-type doped gradient region adjacent n-p-n photodiodes comprising p-type charge collection regions. Of course, the dopant and conductivity type of all structures will change accordingly, with the transfer gate corresponding to a PMOS transistor.

Figure 20:
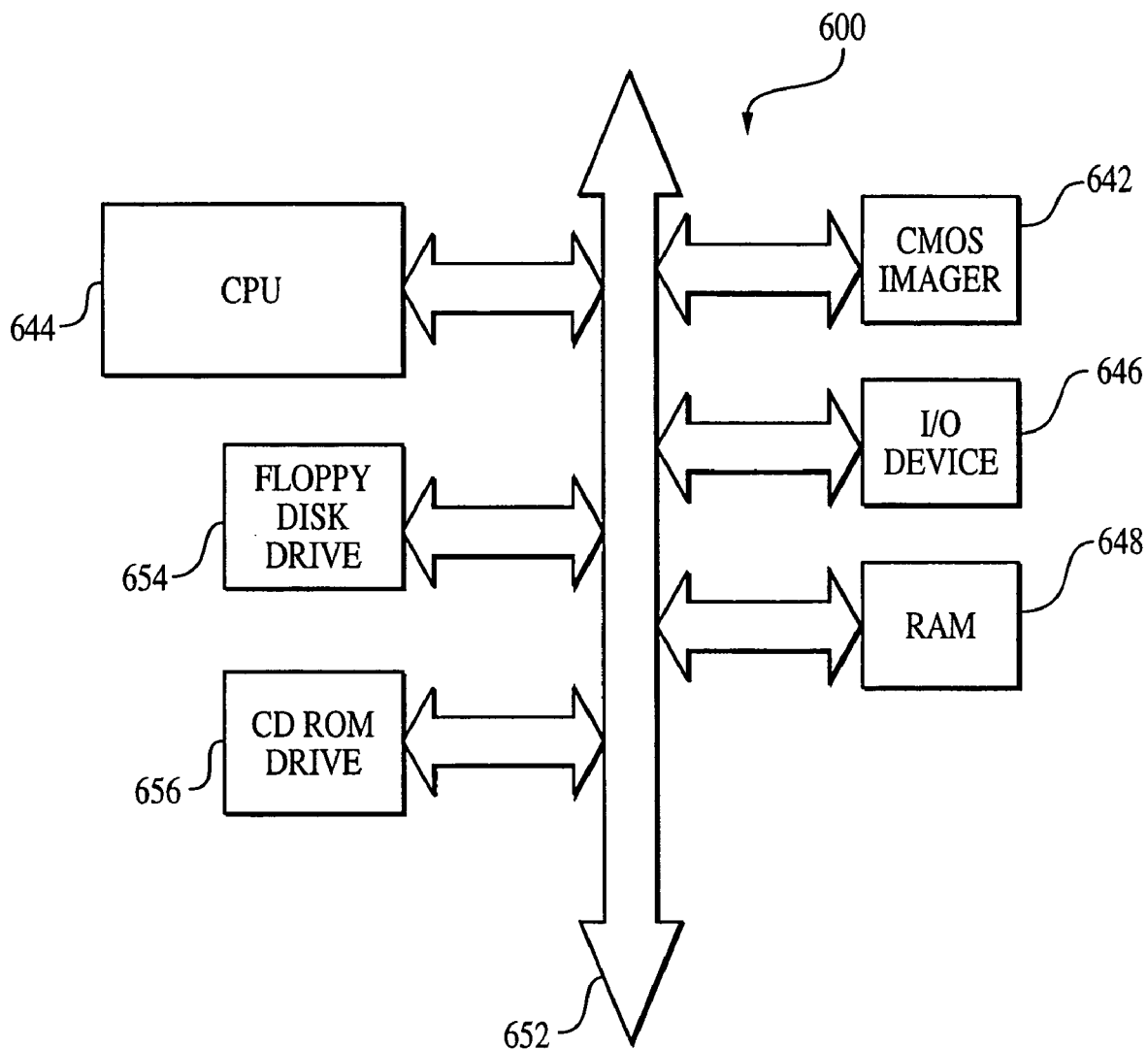
FIG. 20 illustrates a schematic diagram of a computer processor system incorporating a CMOS image sensor fabricated according to the present invention.

The pixels described herein may be employed in a pixel array of a CMOS imager device, for example, a camera which in turn may be coupled to a processor system for image acquisition and/or processing. A typical processor system 600, which has a connected CMOS imager having an array of pixels constructed according to the invention is illustrated in FIG. 20.

A processor system, such as a computer system, for example generally comprises a central processing unit (CPU) 644, for example, a microprocessor, that communicates with one or more input/output (I/O) devices 646. The CMOS imager 642 communicates with the system and processor over bus 652. The computer system 600 also includes random access memory (RAM) 648, and may include peripheral devices such as a floppy disk drive 654, and a compact disk (CD) ROM drive 656 or a flash memory card 657 which also communicate with CPU 644 over the bus 652. It may also be desirable to integrate the processor 654, CMOS image sensor 642 and memory 648 on a single IC chip.

Although the embodiments described above have been described with reference to two different methods for the formation of dopant gradient regions 175, 275 formed below an active area of gate structure 130, it must be understood that the two described methods are only exemplary of the methods which may be used to form a dopant gradient region below the transfer gate region. Accordingly, the invention also contemplates the formation of a uniformly increasing p-type dopant gradient from the left side of the gate channel to the right side of the gate channel.

The above description and drawings are only to be considered illustrative of exemplary embodiments, which achieve the features and advantages of the invention. Modification and substitutions to specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A method of forming a pixel sensor cell, said method comprising:
   forming a charge collection region and a floating diffusion region in a substrate;
   forming a gate of a transfer transistor, over said substrate, for transferring charge from said charge collection region to said floating diffusion region;
   forming a non-uniformly doped region having a lateral dopant gradient of a first conductivity type in said substrate and below said gate, said dopant gradient decreasing in conductivity from said charge collection region to said floating diffusion region;
   forming a first doped layer of said first conductivity type in said substrate, said first doped layer being displaced laterally from an electrically active portion of said gate by a predetermined distance; and
   wherein said charge collection region is of a second conductivity type and is formed in said substrate below said first doped layer.

2. The method of claim 1, wherein said non-uniformly doped region of said first conductivity type is formed to a width of about 500 Angstroms to about 10,000 Angstroms.

3. The method of claim 1, wherein said non-uniformly doped region of said first conductivity type is formed to a width of about 5,000 Angstroms.

4. The method of claim 1, wherein said act of forming said non-uniformly doped region further comprises forming a first implanted region of a first dopant concentration adjacent a second implanted region of a second dopant concentration.

5. The method of claim 4, wherein said first implanted region is formed by implanting ions of said first conductivity type in a first area of said substrate located below said gate.

6. The method of claim 4, wherein said first dopant concentration is within the range of from about $1 \times 10^{16}$ to about $1 \times 10^{19}$ atoms per cm$^3$.

7. The method of claim 6, wherein said first dopant concentration is of about $1 \times 10^{17}$ to about $1 \times 10^{18}$ atoms per cm$^3$.

8. The method of claim 4, wherein said second dopant concentration is of about $2 \times 10^{16}$ to about $2 \times 10^{19}$ atoms per cm$^3$.

9. The method of claim 8, wherein said second dopant concentration is of about $2 \times 10^{17}$ to about $2 \times 10^{18}$ atoms per cm$^3$.

10. The method of claim 4, wherein said second dopant concentration is higher than said first dopant concentration and said second implanted region is adjacent said charge collection region.

11. The method of claim 1, wherein said act of forming said charge collection region of said second conductivity type further comprises implanting an n-type dopant below said first doped layer at a dopant concentration of about $5 \times 10^{14}$ to about $1 \times 10^{18}$ atoms per cm$^3$.

12. The method of claim 1, wherein said first doped layer is a pinned layer.

13. The method of claim 1, wherein said first doped layer is doped with a p-type dopant at a dopant concentration of from about $1 \times 10^{17}$ to about $1 \times 10^{20}$ atoms per cm$^3$.

14. The method of claim 1, wherein said first doped layer of said first conductivity type and said charge collection region of said second conductivity type form part of a p-n-p photodiode.

15. The method of claim 1, wherein said first doped layer is in contact with an isolation region formed within said substrate.

16. The method of claim 1, wherein said first conductivity type is p-type and said second conductivity type is n-type.

17. A method of forming a pixel sensor cell, said method comprising:
   forming a charge collection region and a floating diffusion region in a substrate;
   forming a gate of a transfer transistor, over said substrate, for transferring charge from a charge collection region to a floating diffusion region;
   forming a lateral dopant gradient region of a first conductivity type in said substrate and below said gate, said dopant gradient region including a first area having a first concentration of ions of said first conductivity type and a second area having a second concentration of ions of said first conductivity type that is higher than said first concentration, said dopant gradient region decreasing in conductivity from said charge collection region to said floating diffusion region;
   forming a first doped layer of said first conductivity type in said substrate, said first doped layer being displaced laterally from an electrically active portion of said gate by a predetermined distance;
   wherein said charge collection region is of a second conductivity type and is formed in said substrate below said first doped layer; and
   wherein said floating diffusion region is of said second conductivity type and is formed adjacent said first area of said dopant gradient region.

18. The method of claim 17, wherein said dopant gradient region of said first conductivity type is formed to a width of about 500 Angstroms to about 10,000 Angstroms.

19. The method of claim 17, wherein said dopant gradient region of said first conductivity type is formed to a width of about 5,000 Angstroms.

20. The method of claim 17, wherein said act of forming said charge collection region of said second conductivity type is performed after said formation of said dopant gradient region.

21. The method of claim 20, wherein said charge collection region of said second conductivity type is formed adjacent but laterally displaced from said second area of said dopant gradient region.

22. The method of claim 17, wherein said first dopant concentration is within the range of from about $1\times10^{16}$ to about $1\times10^{19}$ atoms per $cm^3$.

23. The method of claim 22, wherein said first dopant concentration is of about $1\times10^{17}$ to about $1\times10^{18}$ atoms per $cm^3$.

24. The method of claim 17, wherein said second dopant concentration is of about $2\times10^{16}$ to about $2\times10^{19}$ atoms per $cm^3$.

25. The method of claim 24, wherein said second dopant concentration is of about $2\times10^{17}$ to about $2\times10^{18}$ atoms per $cm^3$.

26. The method of claim 17, wherein said second dopant concentration is higher than said first dopant concentration and said second implanted region is adjacent said charge collection region.

27. The method of claim 17, wherein said act of forming said charge collection region of said second conductivity type further comprises implanting an n-type dopant below said first doped layer to form a charge collection region at a dopant concentration of about $5\times10^{14}$ to about $1\times10^{18}$ atoms per $cm^3$.

28. The method of claim 17, wherein said first doped layer is a pinned layer.

29. The method of claim 17, wherein said first doped layer is doped with a p-type dopant at a dopant concentration of from about $1\times10^{17}$ to about $1\times10^{20}$ atoms per $cm^3$.

30. The method of claim 17, wherein said first doped layer of said first conductivity type and said charge collection region of said second conductivity type form part of a p-n-p photodiode.

31. The method of claim 17, wherein said first doped layer is in contact with an isolation region formed within said substrate.

32. The method of claim 17, wherein said first conductivity type is p-type and said second conductivity type is n-type.

33. A method of forming an image sensor, said method comprising:
  forming a photosensor having a charge collection region in a silicon substrate;
  forming a floating diffusion region in said silicon substrate;
  forming a first insulating layer over said silicon substrate;
  forming a conductive layer over said insulating layer;
  forming a second insulating layer over said conductive layer;
  patterning said first insulating layer, said conductive layer, and said second insulating layer to form a gate stack of a charge transfer transistor for transferring charge from said charge collection region to said floating diffusion region; and
  forming a lateral channel region of a first conductivity type within a first area of said substrate and below a surface of said silicon substrate, said channel region formed below said gate stack of said charge transfer transistor and having a potential gradient that favors electron movement from said charge collection region to said floating diffusion region;
  wherein said photosensor is formed in said substrate by the acts of:
    forming a first doped layer of said first conductivity type in said silicon substrate, said first doped layer being laterally displaced from said dopant gradient region; and
    forming said charge collection region of a second conductivity type in said silicon substrate and below said first doped layer.

34. The method of claim 33, wherein said potential gradient is formed as a dopant gradient arranged within said channel region.

35. The method of claim 34, wherein said dopant gradient region is formed to a width of about 500 Angstroms to about 10,000 Angstroms.

36. The method of claim 35, wherein said dopant gradient region is formed to a width of about 5,000 Angstroms.

37. The method of claim 34, wherein said act of forming said dopant gradient region further comprises forming a first implanted region of a first dopant concentration and an adjacent second implanted region of a second dopant concentration.

38. The method of claim 37, wherein said second dopant concentration is higher than said first dopant concentration and said second implanted region is adjacent said charge collection region.

39. The method of claim 34, wherein said first implanted region is formed by implanting ions of said first conductivity type in said first area of said substrate.

40. The method of claim 34, wherein said first dopant concentration is of about $1\times10^{16}$ to about $1\times10^{19}$ atoms per $cm^3$.

41. The method of claim 40, wherein said first dopant concentration is of about $1\times10^{17}$ to about $1\times10^{18}$ atoms per $cm^3$.

42. The method of claim 34, wherein said second dopant concentration is of about $2\times10^{16}$ to about $2\times10^{19}$ atoms per $cm^3$.

43. The method of claim 42, wherein said second dopant concentration is of about $2\times10^{17}$ to about $2\times10^{18}$ atoms per $cm^3$.

44. The method of claim 34, wherein said act of forming said charge collection region of said second conductivity type further comprises implanting an n-type dopant below said first doped layer to form said charge collection region at a dopant concentration of about $5\times10^{14}$ to about $1\times10^{13}$ atoms per $cm^3$.

45. The method of claim 33, wherein said first doped layer is a pinned layer.

46. The method of claim 33, wherein said first doped layer is doped with a p-type dopant at a dopant concentration of about $1\times10^{17}$ to about $1\times10^{20}$ atoms per $cm^3$.

47. The method of claim 33, wherein said photosensor is a p-n-p photodiode.

48. The method of claim 33, wherein said first doped layer is in contact with an isolation region formed within said substrate.

49. The method of claim 33, wherein said first conductivity type is p-type and said second conductivity type is n-type.

50. A method of forming an image sensor, the method comprising:
  forming a removable layer over a surface of a substrate;

patterning said removable layer to form a first opening having sidewalls spaced apart by a first width;

implanting ions having a first concentration into said substrate through said first opening in said removable layer to form a first implant region of a first conductivity type;

forming a second opening in a removable layer of said surface of said substrate, said second opening having sidewalls spaced apart by a second width less than said first width;

implanting ions having a second concentration through said second opening into said substrate to form a second implant region, said first and second implant regions decreasing in conductivity from a charge collection area to a floating diffusion region;

forming a gatestack of a charge transfer transistor above said first and second implant regions, said charge transfer transistor for transferring charge from said charge collection area to said floating diffusion region; and forming a photosensor having said charge collection area in said substrate, said charge collection area being located adjacent at least one of said first and second implant regions.

51. The method of claim 50, wherein the width of the second opening is approximately half the width of the first opening.

52. The method of claim 50, wherein the width of the second opening is half the width of the first opening.

53. The method of claim 50, wherein the act of implanting ions having a second concentration comprises implanting ions of said first conductivity type.

54. A method of forming an image sensor, the method comprising:

forming a removable layer over a surface of a substrate;
patterning said removable layer to form a first opening having sidewalls spaced apart by a first width;

implanting ions having a first concentration into said substrate through said first opening in said removable layer to form a first implant region of a first conductivity type;

forming a second opening in a removable layer of said surface of said substrate, said second opening having sidewalls spaced apart by a second width less than said first width;

implanting ions having a second concentration through said second opening into said substrate to form a second implant region;

forming a gatestack above said first and second implant regions; and forming a photosensor having a charge collection area in said substrate, said charge collection area being located adjacent at least one of said first and second implant regions, wherein the act of implanting ions having a second concentration comprises implanting ions of a second conductivity type.

55. A method of forming an image sensor, the method comprising:

forming a removable layer over a surface of a substrate;

patterning said removable layer to form a first opening having sidewalls spaced apart by a first width;

implanting ions having a first concentration into said substrate through said first opening in said removable layer to form a first implant region of a first conductivity type;

forming a second opening in a removable layer of said surface of said substrate, said second opening having sidewalls spaced apart by a second width less than said first width;

implanting ions having a second concentration through said second opening into said substrate to form a second implant region;

forming a gatestack above said first and second implant regions; and forming a photosensor having a charge collection area in said substrate, said charge collection area being located adjacent at least one of said first and second implant regions, wherein the second implant region is formed at least partially within said first implant region.

56. The method of claim 55, wherein the second implant region is formed entirely within said first implant region.

* * * * *